(12) United States Patent
Fujii

(10) Patent No.: US 8,736,146 B2
(45) Date of Patent: May 27, 2014

(54) ELECTRIC POWER DEVICE, ELECTRIC POWER GENERATION METHOD, AND PRODUCTION METHOD OF ELECTRIC POWER DEVICE

(75) Inventor: Yasuhisa Fujii, Kyoto (JP)

(73) Assignee: Empire Technology Development LLC, Wilmington, DE (US)

( * ) Notice: Subject to any disclaimer, the term of this patent is extended or adjusted under 35 U.S.C. 154(b) by 482 days.

(21) Appl. No.: 12/641,662

(22) Filed: Dec. 18, 2009

(65) Prior Publication Data

US 2010/0295419 A1 Nov. 25, 2010

(30) Foreign Application Priority Data

May 19, 2009 (JP) ................................ 2009-121414

(51) Int. Cl.
*H01L 41/113* (2006.01)
(52) U.S. Cl.
USPC .......................................................... 310/339
(58) Field of Classification Search
USPC .......................................................... 310/339
See application file for complete search history.

(56) References Cited

U.S. PATENT DOCUMENTS

| | | | | | |
|---|---|---|---|---|---|
| 3,100,821 | A | * | 8/1963 | Swinehart et al. | 381/161 |
| 3,856,995 | A | * | 12/1974 | Cragg et al. | 381/338 |
| 4,072,936 | A | * | 2/1978 | Spirig | 340/566 |
| 5,861,018 | A | | 1/1999 | Feierbach | |
| 6,060,817 | A | * | 5/2000 | Mullen et al. | 310/339 |
| 6,223,601 | B1 | * | 5/2001 | Harada et al. | 73/649 |
| 6,336,366 | B1 | * | 1/2002 | Thundat et al. | 73/514.34 |
| 6,438,243 | B1 | * | 8/2002 | Ikeuchi et al. | 381/191 |
| 6,661,161 | B1 | * | 12/2003 | Lanzo et al. | 310/334 |
| 6,798,716 | B1 | | 9/2004 | Charych | |
| 7,183,693 | B2 | * | 2/2007 | Brantner et al. | 310/319 |
| 7,520,173 | B2 | * | 4/2009 | Lee et al. | 73/754 |
| 2002/0043895 | A1 | * | 4/2002 | Richards et al. | 310/328 |
| 2002/0167249 | A1 | * | 11/2002 | Fukukita | 310/334 |
| 2002/0179984 | A1 | * | 12/2002 | Ren et al. | 257/416 |
| 2003/0119220 | A1 | * | 6/2003 | Mlcak et al. | 438/52 |
| 2004/0075363 | A1 | * | 4/2004 | Malkin et al. | 310/321 |
| 2005/0280334 | A1 | * | 12/2005 | Ott et al. | 310/339 |
| 2007/0089515 | A1 | * | 4/2007 | Shih et al. | 73/579 |

(Continued)

FOREIGN PATENT DOCUMENTS

| | | |
|---|---|---|
| JP | H06-046539 | 2/1994 |
| JP | 06-046539 | 6/1994 |

(Continued)

OTHER PUBLICATIONS

Kymissis, J. et al., "Parasitic Power Harvesting in Shoes," *Second IEEE International Conference on Wearable Computing*, Aug. 1998.

(Continued)

*Primary Examiner* — Thomas Dougherty
(74) *Attorney, Agent, or Firm* — Foley & Lardner LLP

(57) ABSTRACT

There is provided a new self-generating electric power device using a piezoelectric element. An electric power device includes: a resonant portion that is secured at least at one end, receives waves propagating through a space or a medium and resonates; a piezoelectric element that is formed to connect to the resonant portion, and generates a voltage according to resonance of the resonant portion; and a first electrode and a second electrode that are formed on opposite surfaces of the piezoelectric element, and output the generated voltage.

13 Claims, 13 Drawing Sheets

(56) References Cited

U.S. PATENT DOCUMENTS

| | | | |
|---|---|---|---|
| 2007/0125176 A1* | 6/2007 | Liu | 73/649 |
| 2008/0079333 A1* | 4/2008 | Ulm et al. | 310/339 |
| 2008/0174273 A1* | 7/2008 | Priya et al. | 320/114 |
| 2009/0045700 A1* | 2/2009 | Sasaki et al. | 310/348 |
| 2009/0167114 A1* | 7/2009 | Sapir | 310/339 |
| 2010/0033058 A1* | 2/2010 | Lee et al. | 310/323.21 |
| 2011/0006286 A1* | 1/2011 | Wang et al. | 257/24 |

FOREIGN PATENT DOCUMENTS

| | | | |
|---|---|---|---|
| JP | H07-245970 | 9/1995 | |
| JP | 7-298394 A | * 11/1995 | H04R 17/00 |
| JP | H11-303726 | 11/1999 | |
| JP | 2001-275370 | 10/2001 | |
| JP | 2002-078360 | 3/2002 | |
| JP | 2007-143353 | 6/2007 | |
| JP | 2008-234529 | 10/2008 | |
| JP | 2008-268098 | 11/2008 | |

OTHER PUBLICATIONS

Notice of Reasons for Rejection for JP 2009-121414 mailed Jun. 12, 2009 (with English translation).

Decision of Rejection for JP 2009-121414 mailed Nov. 30, 2009 (with English translation).

* cited by examiner

ELECTRIC POWER DEVICE, ELECTRIC POWER GENERATION METHOD, AND PRODUCTION METHOD OF ELECTRIC POWER DEVICE

CROSS REFERENCE TO RELATED APPLICATION

This application claims the benefit of Japanese Application No. 2009-121414 filed on May 19, 2009 which is incorporated herein by reference.

BACKGROUND OF THE INVENTION

1. Field of the Invention

The present disclosure relates to an electric power device, an electric power generation method, and a production method of the electric power device.

2. Description of the Related Art

A primary battery has been conventionally used as an electric power source (electric power device) of an implantable medical device, for example, a cardiac pacemaker or an insulin infusion device. The primary battery cannot be used once discharged, and when the primary battery is used as an electric power source of an implantable medical device, an incision needs to be made in the body of a patient for each replacement of the battery. This is not always desirable in view of physical and economic aspects of the patient.

Thus, a self-generating electric power source that does not require battery replacement is desirably used as an electric power source of an implantable medical device or the like.

A conventional electric power source that does not require battery replacement includes, for example, an electric power device using a solar cell or a piezoelectric element (for example, see John Kymissis, MIT, "Parasitic Power Harvesting in Shoes", Second IEEE International Conference on Wearable Computing, August 1998).

However, it is difficult to use the conventional electric power source that does not require battery replacement as an electric power source of an implantable medical device. Specifically, the solar cell generates electric power under light irradiation, but when the solar cell is implanted in the body, the light irradiation is blocked by skin or cloths of a human, which makes it difficult to ensure a sufficient amount of generated electric power. Meanwhile, the electric power device using the piezoelectric element generally generates electric power by directly applying a force to the piezoelectric element to deform the piezoelectric element, and once the piezoelectric element is implanted in the body, the force cannot be directly applied thereto, and thus such an electric power device is difficult to apply to the implantable medical device.

Therefore, it is desired to provide a new electric power device that solves the above-described problems and can be applied as an electric power source of an implantable medical device, an electric power generation method, and a production method of the electric power device.

SUMMARY OF THE INVENTION

An electric power device according to the present disclosure includes: a resonant portion that is secured at least at one end, receives waves propagating through a space or a medium and resonates; a piezoelectric element that is formed to connect to the resonant portion, and generates a voltage according to resonance of the resonant portion; and a first electrode and a second electrode that are formed on opposite surfaces of the piezoelectric element, and output the generated voltage.

In the electric power device according to the present disclosure, the resonant portion may include a plurality of resonant bodies. Further, the plurality of resonant bodies may include at least two resonant bodies having different resonance frequencies.

Further, in the electric power device according to the present disclosure, the plurality of resonant bodies may be arranged in parallel or concentrically.

Further, in the electric power device according to the present disclosure, the resonant portion may be a cantilever having one end secured and the other end that is a free end.

A system according to the present disclosure includes: the electric power device according to the present disclosure; and a load device to which electric power generated by the electric power device is supplied. The system according to the present disclosure also includes: the electric power device according to the present disclosure; and a frequency generation device that generates waves having a particular frequency component toward a resonant portion included in the electric power device.

An electric power generation method according to the present disclosure is such that a resonant portion secured at least at one end receives waves propagating through a space or a medium and resonates; a piezoelectric element formed to connect to the resonant portion generates a voltage according to resonance of the resonant portion; and a first electrode and a second electrode formed on opposite surfaces of the piezoelectric element output the generated voltage.

A production method of an electric power device according to the present disclosure is a production method of an electric power device including: a resonant portion that is secured at least at one end, receives waves propagating through a space or a medium and resonates; a piezoelectric element that is formed to connect to the resonant portion, and generates a voltage according to resonance of the resonant portion; and a first electrode and a second electrode that are formed on opposite surfaces of the piezoelectric element, and output the generated voltage, and the method including: forming a semiconductor substrate layer so as to match a shape of a resonant portion secured at least at one end; forming a first electrode layer at least in a region forming the resonant portion on the semiconductor substrate layer; forming a piezoelectric element layer in a region forming the resonant portion on the first electrode layer; forming a second electrode layer in a region forming the resonant portion on the piezoelectric element layer; and forming the semiconductor substrate layer so as to match a shape of a support portion that secures one end of the resonant portion.

DETAILED DESCRIPTION OF THE PREFERRED EMBODIMENTS

Figure 1:
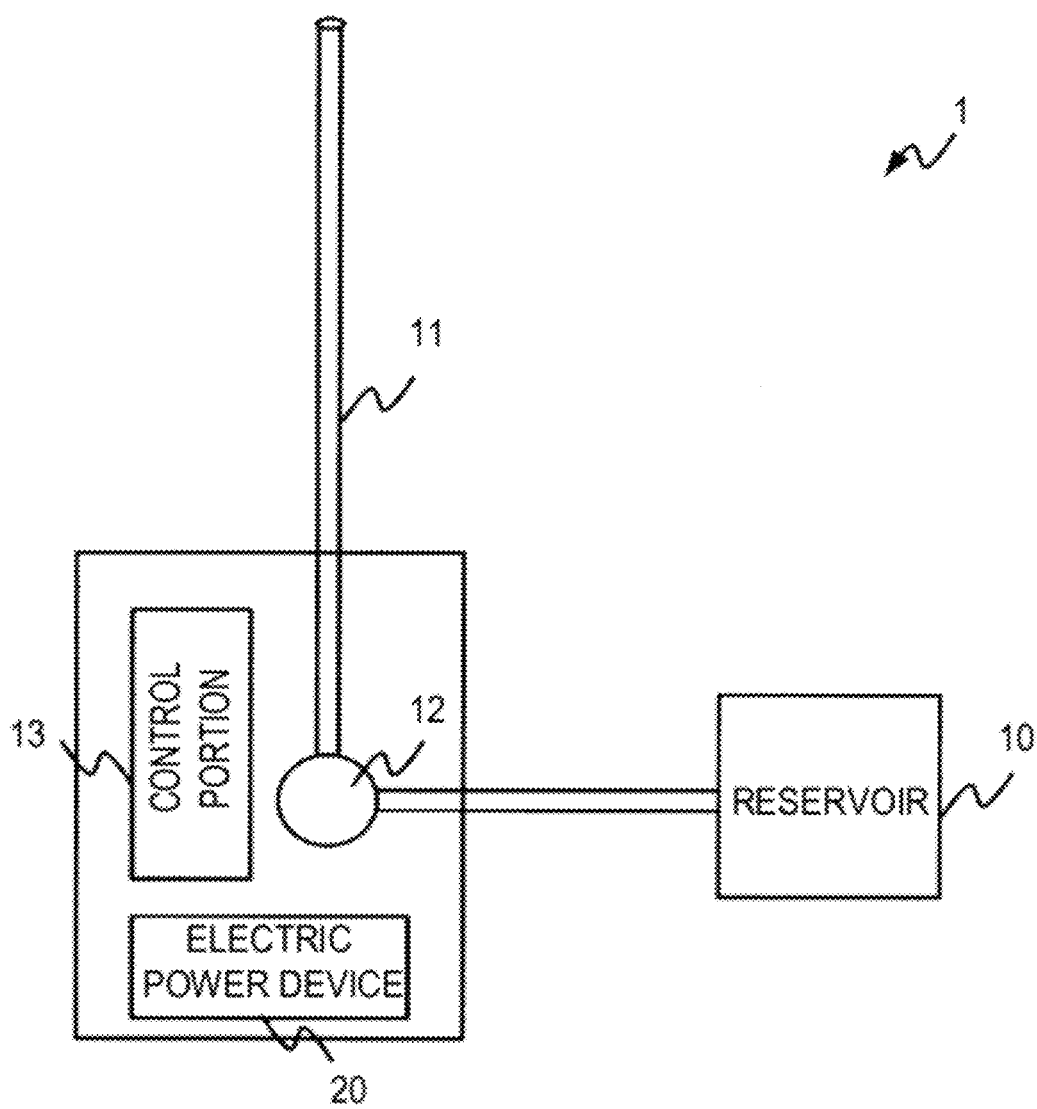
FIG. 1 is a block diagram showing a schematic configuration of an insulin infusion device 1 according to this embodiment.

Here, a preferred embodiment for carrying out the present disclosure will be described with reference to the drawings. In this embodiment, as a device to which an electric power device of the present disclosure is applied, an insulin infusion device that is an implantable medical device is taken by way of example. Sizes or positional relationships of members in the drawings are exaggerated for clear illustration in some cases.

First Embodiment

FIG. 1 is a block diagram showing a schematic configuration of an insulin infusion device 1 according to a first embodiment of the present disclosure.

The insulin infusion device 1 is an implantable insulin infusion device that supplies insulin at appropriate time. The insulin infusion device 1 includes, for example, as shown in FIG. 1, a reservoir 10 that stores the insulin, a pump 12 that obtains the insulin from the reservoir 10, and dispenses the insulin to portal via a catheter 11, a control portion 13 that performs various controls such as detection of a flow rate of the insulin having passed through the pump 12, an electric power device 20 that operates load devices such as the pump 12 and the control portion 13, or the like. Electric power generated by the electric power device 20 is once charged in, for example, a charging device (not shown), and the electric power can be obtained from the charging device as required to operate the load device or the like. However, the electric power device 20 of the present disclosure is not limited to the case where the electric power is once charged in the charging device, but may be configured so that the generated electric power is directly supplied to the load device to operate the pump 12 or the like. The insulin infusion device 1 of the present disclosure may have the same configuration and function as a conventional insulin infusion device except the electric power device 20, and detailed descriptions thereof will be omitted.

The electric power device 20 of this embodiment receives waves propagating through a space or a medium to generate electric power. The waves in this embodiment are signals having a periodical AC component, and mean a concept including waves such as sound waves or ultrasonic waves.

Figure 2:
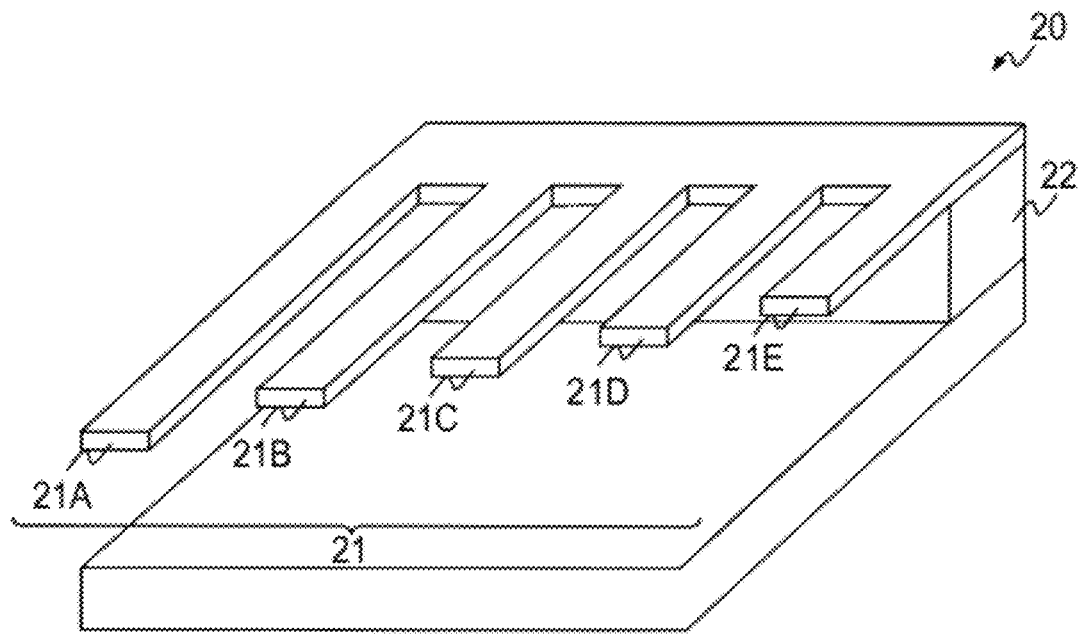
FIG. 2 is a view showing a schematic configuration of an electric power device 20 according to this embodiment.

As shown in FIG. 2, the electric power device 20 includes an electric power generation portion (resonant portion) 21 and a support base (support portion) 22, and can generate electric power required for operating the pump 12, for example, electric power of mW order.

The support base 22 secures one end of the electric power generation portion 21 in a cantilevered manner. In FIG. 2, the support base 22 has an L shape, but may have a different shape as long as the support base 22 can be placed in the insulin infusion device 1.

The electric power generation portion 21 includes a plurality of electric power units 21A to 21E, receives waves propagating through a space or a medium (for example, skin) and resonates, and generates electric power. The plurality of electric power units 21A to 21E are arranged in parallel so that one end of each of the electric power units 21A to 21E is secured to the support base 22, and the electric power units 21A to 21E can receive the waves with directivity.

Figure 3:
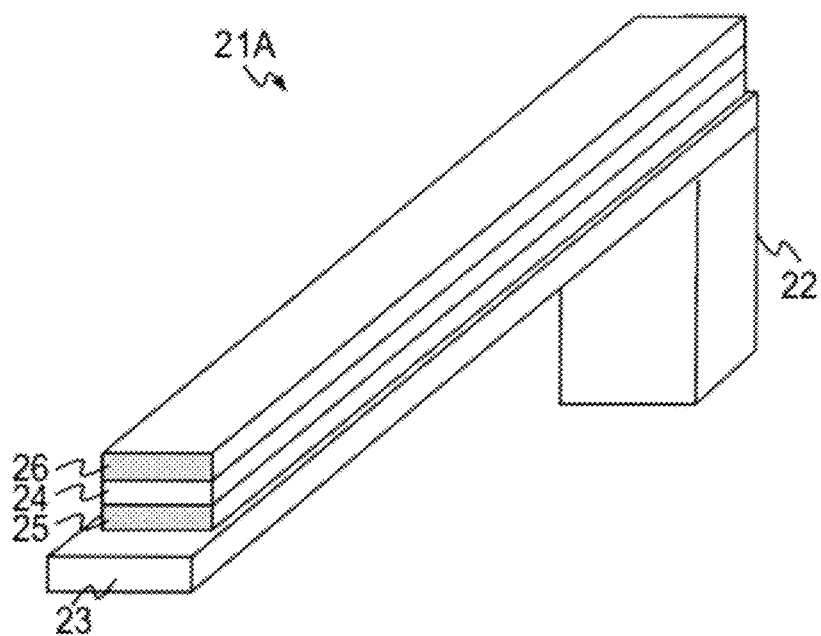
FIG. 3 is a view showing a schematic configuration of an electric power unit 21A in the electric power device 20 according to this embodiment.

To describe the electric power unit in detail, an example of a schematic configuration of the electric power unit 21A is shown in FIG. 3.

As shown in FIG. 3, the electric power unit 21A includes a cantilever (resonant body) 23, a piezoelectric element 24, a first electrode 25 and a second electrode 26.

The cantilever 23 is a part that is secured at least at one end, and receives waves propagating through a space or a medium and resonates, and has a particular resonance frequency. The resonance frequency can be set by a shape of an object such as a width, a thickness, or a length of the cantilever 23, and a Young's modulus and a mass or the like that depend on a material of the object, and can be generally expressed by the following Expression (1). In the Expression (1), reference character f denotes a resonance frequency, k denotes a spring constant (N/mm), E denotes a Young's modulus (N/mm$^2$), b denotes a width of a material (mm), t denotes a thickness of the material (mm), and L denotes a length of the material. For example, when the Young's modulus, the mass, the width, the thickness, and the length of the material of the cantilever 23 are $1.9 \times 10^5$ N/mm$^2$, $2.76 \times 10^{-8}$ kg, 1 mm, 0.03 mm, and 0.4 mm, the resonance frequency of the cantilever 23 is about 135 kHz. A resonance frequency of the electric power unit 21A itself is determined by the influence of the piezoelectric element 24 formed to connect to the cantilever 23. Thus, to obtain a desired resonance frequency of the electric power unit 21A, for example, it is sufficient that an experiment is repeated for measuring the resonance frequency of the electric power unit 21A while adjusting the shape such as the width, the length, and the thickness of the cantilever 23.

[Expression 1]

$$f = \frac{1}{2\pi} \times \sqrt{k/m}$$

$$k = (E \times b \times t^3)/(4 \times L^3) \qquad (1)$$

The piezoelectric element 24 is formed to connect to the cantilever 23, and is deformed according to resonance of the cantilever 23 to generate a voltage. Specifically, the cantilever 23 receives waves propagating through a space or a medium and resonates to bend the cantilever 23, and thus causes vibration or displacement of the piezoelectric element 24 and generates electric power. The piezoelectric element 24 itself has the same operation and effect as a conventional piezoelectric element, and detailed descriptions thereof will be omitted.

The first electrode 25 and the second electrode 26 are formed on opposite surfaces of the piezoelectric element 24 as shown in FIG. 3, and outputs the voltage generated by the piezoelectric element 24. Conventional electrodes may be used as the first electrode 25 and the second electrode 26, and for example, the first electrode 25 may be a Pt/Ti electrode and the second electrode 26 may be a Cr/Au electrode.

The electric power units 21B to 21E are configured in the same manner as the electric power unit 21A. However, in the electric power device 20 of this embodiment, the cantilevers 23 of the electric power units 21A to 21E have different lengths so that the electric power units 21A to 21E have different resonance frequencies. Not limited to the case where the cantilevers 23 of the electric power units 21A to 21E have different lengths, for example, the electric power units 21A to 21E may have different resonance frequencies by the shape such as the thickness or the width, or the material of the cantilever 23, or a combination thereof. In the electric power device 20, the number of electric power units is not limited to five as described above, but may be increased or decreased according to an amount of electric power required. For example, one electric power unit, or 100 or 1000 electric power units may be provided.

Further, an optimum resonance frequency of the electric power unit may be chosen according to an external environment or the like where the electric power device 20 is used, and may be determined, for example, within a frequency range of 1 to 4 kHz of sound waves audible in nature. Also, not limited to the case where the plurality of electric power units all have different resonance frequencies, but the plurality of electric power units may partly have different resonance frequencies, or all have the same resonance frequency. For example, when waves receivable in the environment where the electric power device 20 is used include frequency components in a wide range, the plurality of electric power units all have different resonance frequencies, and when the receivable waves include a large amount of a particular frequency component, the plurality of electric power units each have the particular frequency component as a resonance frequency, thereby allowing a voltage to be efficiently output according to the environment.

Since the first electrode 25 is placed on the support base 22, the first electrode 25 may have a shape matching the shape of the support base 22 so that the first electrodes 25 of the plurality of electric power units 21A to 21E form a common electrode. Meanwhile, since the second electrode 26 is placed on the piezoelectric element 24, the second electrode 26 may have a shape matching the shape of the piezoelectric element 24. The shapes of the first electrode 25 and the second electrode 26 are not limited to those described above, but may be various shapes as long as the electrodes can output the voltage generated by each piezoelectric element 24.

As described above, in the electric power device 20, the cantilever 23 secured at least at one end receives waves propagating through a space or a medium and resonates, the piezoelectric element 24 formed to connect to the cantilever 23 generates the voltage according to resonance of the cantilever 23, the first electrode 25 and the second electrode 26 formed on the opposite surfaces of the piezoelectric element 24 output the generated voltage.

The electric power device 20 of this embodiment can perform self-generation by receiving waves propagating through a space or a medium, and thus can be used as an electric power source even in a place where light irradiation is blocked. Also, the number of the electric power units, the shape of the cantilever 23 in the electric power unit, or the like can be changed to generate desired electric power according to an environment. Further, the plurality of electric power units are arranged in parallel to allow resonance in view of directivity of received waves, and thus allow electric power to be efficiency generated.

According to the insulin infusion device 1 of this embodiment including such an electric power device 20, electric power can be generated according to frequency signals such as sound outside the body, thereby reducing the need to make an incision in the body of the patient for each replacement of the battery as the primary battery.

Second Embodiment

An insulin infusion device system 100 according to a second embodiment of the present disclosure is different from the first embodiment in including a dedicated wave generation device 2 for resonating the cantilever 23.

Figure 4:
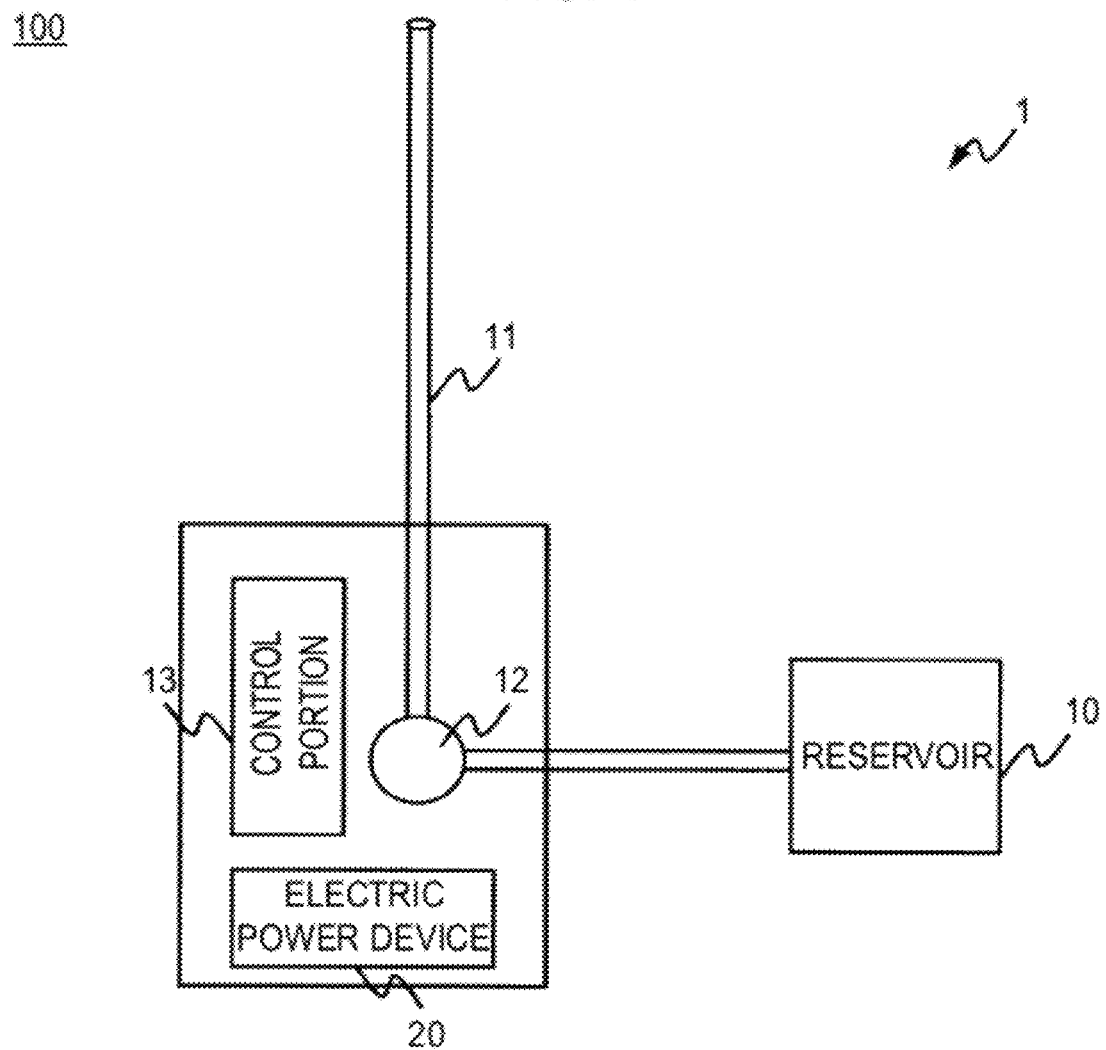
FIG. 4 is a block diagram showing a schematic configuration of an insulin infusion device system 100 according to this embodiment.
Figure 4:
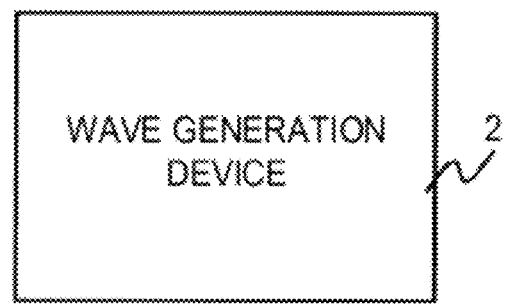

FIG. 4 is a block diagram showing a schematic configuration of the insulin infusion device system 100 according to this embodiment.

As shown in FIG. 4, the insulin infusion device system 100 includes an insulin infusion device 1 and the wave generation device 2. The insulin infusion device 1 according to the second embodiment can be the same as the insulin infusion device 1 in the first embodiment, and thus detailed descriptions thereof will be omitted here.

The wave generation device 2 generates waves having a particular frequency component toward an electric power generation portion 21 included in an electric power device 20 in the insulin infusion device 1. In the wave generation device 2, a frequency component of generated waves can be set according to a resonance frequency of the electric power generation portion 21. The wave generation device 2 may have the same configuration and function as a conventional wave generation device, for example, a sound wave generation device or an ultrasonic wave generation device, and thus detailed descriptions thereof will be omitted.

According to the insulin infusion device system 100 of this embodiment, the external wave generation device 2 generates the waves having the particular frequency component, and thus the electric power device 20 can reliably and stably receive the waves, thereby allowing the electric power device 20 to output a voltage as desired by a user.

<Production Method of Electric Power Device>

Figure 5A:
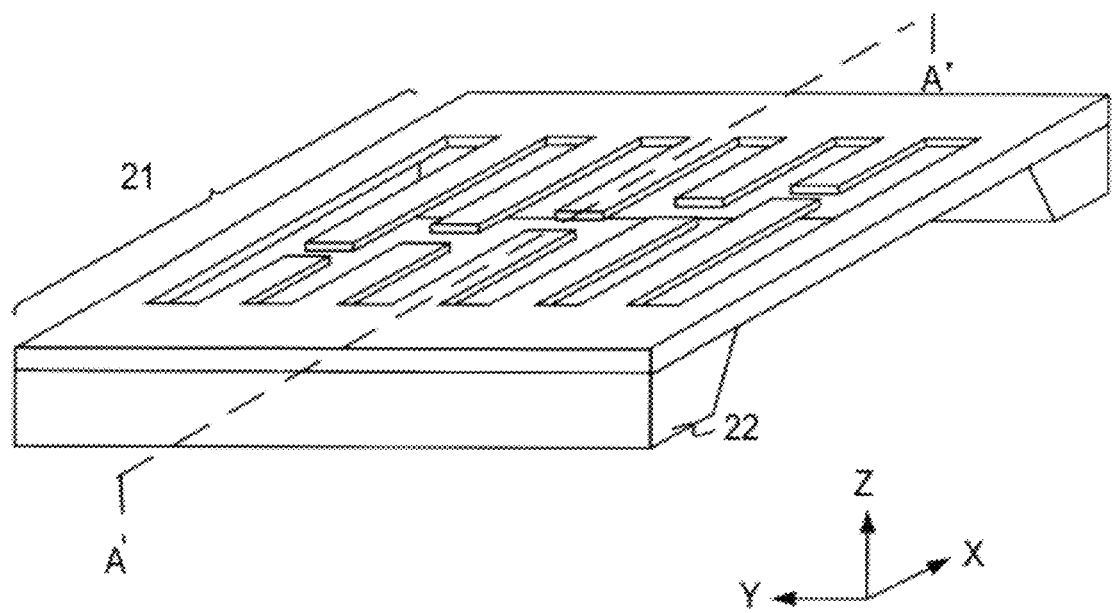
FIG. 5A is a view for illustrating a production method of the electric power device 20 according to this embodiment.

Here, a production method of an electric power device 20 according to the present disclosure will be described in detail with reference to FIGS. 5 and 6. FIG. 5 shows an example of the electric power device 20 produced in this disclosure, FIG. 5A is a perspective view of the electric power device 20, FIG.

Figure 5B:
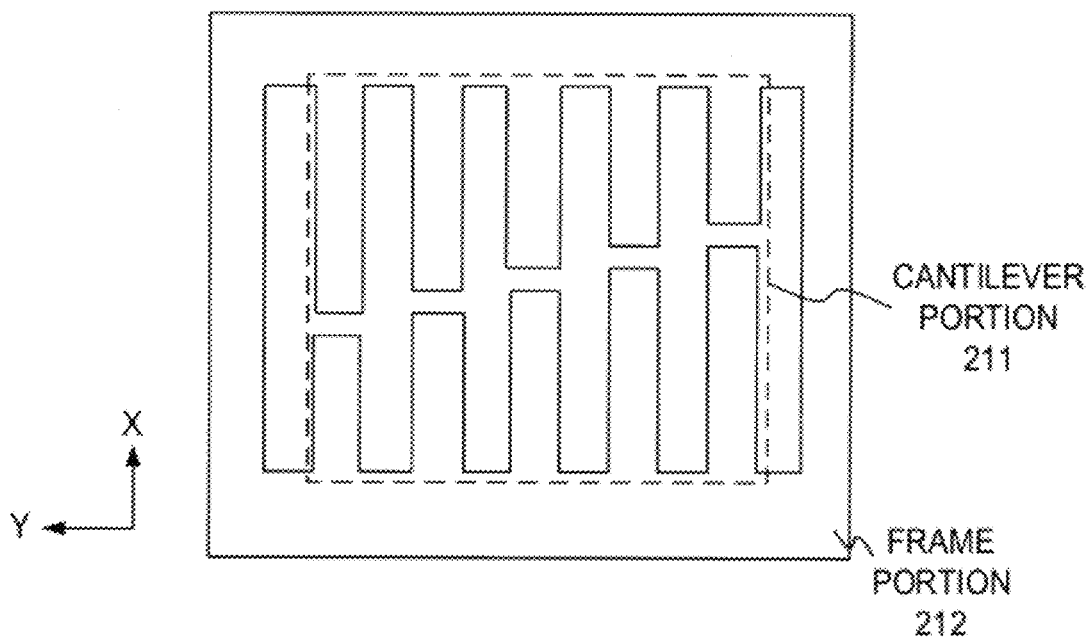
FIG. 5B is a view for illustrating the production method of the electric power device 20 according to this embodiment.
Figure 5C:
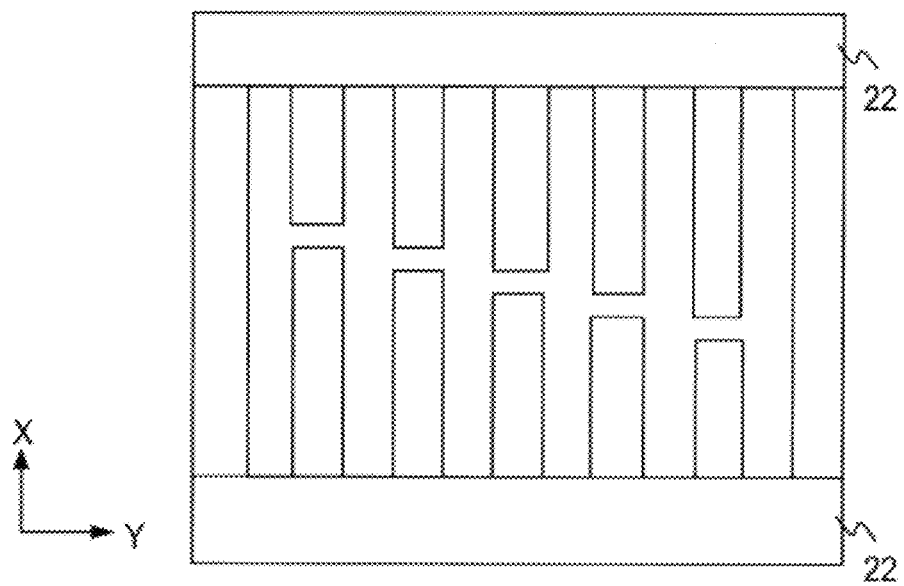
FIG. 5C is a view for illustrating the production method of the electric power device 20 according to this embodiment.

5B is a top view, and FIG. 5C is a bottom view. As shown in FIG. 5A, the electric power device 20 of the present disclosure includes an electric power generation portion 21 having a structure in which one end of each of a plurality of electric power units is secured in parallel on opposite sides of a support base 22, and the other end is a free end in the middle. More specifically, as shown in FIG. 5B, the electric power generation portion 21 of the electric power device 20 of the present disclosure includes a cantilever portion 211 and a frame portion 212, and the cantilever portion 211 may have a structure in which comb-shaped electric power units protruding from the opposite sides that constitute the frame portion 212 toward the middle face each other. In FIG. 5, a first electrode, a piezoelectric element, and a second electrode are not shown. FIG. 6 shows steps of the production method of the electric power device 20 of the present disclosure, and FIGS. 6A to 6K show production steps of the electric power device 20 seen from the section taken along the dotted line A-A' in FIG. 5A. The electric power device 20 of the present disclosure may have a plane size of 10×10 mm$^2$ and a height (thickness) of 1 mm.

The production method of the electric power device 20 mainly includes the steps of: forming a semiconductor substrate layer so as to match a shape of a cantilever that constitutes each electric power unit; forming a first electrode layer; forming a piezoelectric element layer; forming a second electrode layer; and forming the semiconductor substrate layer so as to match a shape of a support portion that secures one end of the cantilever.

Figure 6A:
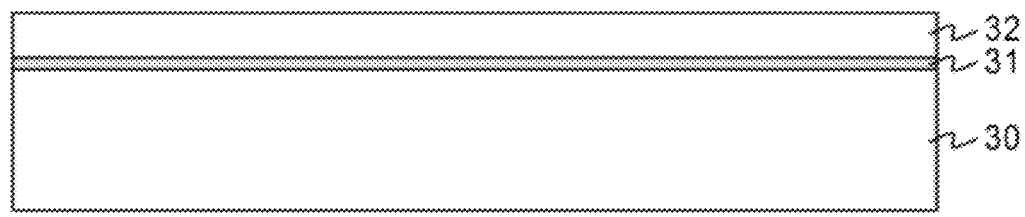
FIG. 6A is a view showing each step of the production method of the electric power device 20 according to this embodiment.

First, as a previous step of the step of forming the semiconductor substrate layer so as to match the shape of the cantilever, as shown in FIG. 6A, a substrate is prepared in which a first semiconductor substrate layer (Si wafer) 30, a first oxide film 31, and a second semiconductor substrate layer 32 (Si wafer) are stacked in order. In this embodiment, a semiconductor substrate layer that forms a support base is the first semiconductor substrate layer, and a semiconductor substrate layer that forms the cantilever is the second semiconductor substrate layer. The first semiconductor substrate layer 30, the first oxide film 31, and the second semiconductor substrate layer 32 may have thicknesses of, for example, 300 µm, 1 µm, and 30 µm.

Then, the step of forming the second semiconductor substrate layer 32 so as to match the shape of the cantilever is performed. This step is a step of mainly etching the second semiconductor substrate layer 32 to determine a width and a length of the cantilever 23.

Figure 6B:
FIG. 6B is a view showing each step of the production method of the electric power device 20 according to this embodiment.

In this step, a film forming process of a second oxide film 33 and a third oxide film 34 is first performed. Specifically, the second oxide film 33 and the third oxide film 34 are formed by thermal oxidation on a lower surface of the first semiconductor substrate layer 30 and an upper surface of the second semiconductor substrate layer 32. The second oxide film 33 and the third oxide film 34 form protective films for protecting portions that are not etched on the first semiconductor substrate layer 30 and the second semiconductor substrate layer 32 from a resist material. FIG. 6B shows a state after the film forming process of the second oxide film 33 and the third oxide film 34 is performed. The second oxide film 33 and the third oxide film 34 each may have a thickness of, for example, 1 µm.

Then, a resist application process and a baking process on the third oxide film 34 are performed. The resist application process is a process for applying a thin photoresist using a spinner. The baking process is a process for drying to vaporize and cure a solvent of the resist using a hot plate. The applied resist may have a thickness of, for example, 1 µm. As the photoresist in this embodiment, a positive photoresist (for example, OFPR-800) is used. The resist application process and the baking process may be performed in the same manner as known process methods, and thus detailed descriptions thereof will be omitted.

Next, an exposure process and a development process are performed. The exposure process is, for example, a process for exposure through a photo mask patterned to have a pattern including the cantilever portion 211 and the frame portion 212 as illustrated in FIG. 5B using a double-sided exposure device. The development process is a process for removing the resist while leaving a portion that is not exposed by the photo mask. The exposure process and the development process may be performed in the same manner as known process methods, and thus detailed descriptions thereof will be omitted.

Figure 6C:
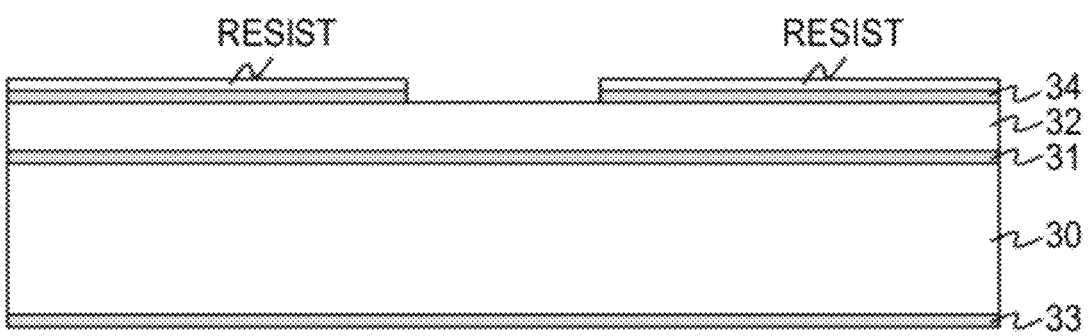
FIG. 6C is a view showing each step of the production method of the electric power device 20 according to this embodiment.

Next, an etching process of the third oxide film 34 is performed. This process is a process for dissolving and removing a portion without the resist film on the third oxide film 34. For example, when reactive ion etching (RIE) is performed for about 60 minutes using a CHF3 gas on the third oxide film 34, the portion without the resist film can be dissolved and removed. FIG. 6C shows a state after the etching process of the third oxide film 34 is performed.

Figure 6D:
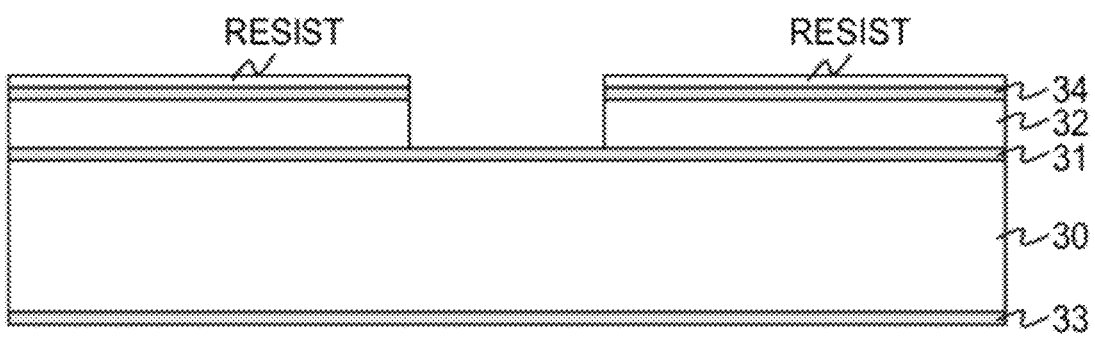
FIG. 6D is a view showing each step of the production method of the electric power device 20 according to this embodiment.

Then, an etching process of the second semiconductor substrate layer 32 is performed. This process is a process for dissolving and removing a portion without the resist film on the second semiconductor substrate layer 32. For example, when reactive ion etching (RIE) is performed for about 45 minutes using a SF6 gas on the second semiconductor substrate layer 32, the portion without the resist film can be dissolved and removed. FIG. 6D shows a state after the etching process of the second semiconductor substrate layer 32 is performed. By the above-described process, as shown in FIG. 6D, the second semiconductor substrate layer 32 can be formed so as to match the shape of the cantilever.

Figure 6E:
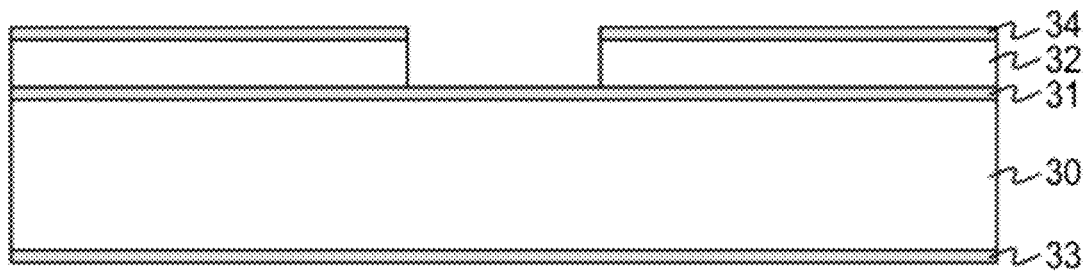
FIG. 6E is a view showing each step of the production method of the electric power device 20 according to this embodiment.

Then, a resist delamination process is performed. This process is a process for removing only the photoresist existing on the remaining second semiconductor substrate layer 32 and cleaning with pure water. The resist delamination process may be performed in the same manner as a known process method, and thus detailed descriptions thereof will be omitted. FIG. 6E shows a state after the resist delamination process is performed.

Then, a process for removing the third oxide film 34 is performed. For example, when reactive ion etching (RIE) is performed for about 60 minutes using a CHF3 gas, the third oxide film 34 existing on the remaining second semiconductor substrate layer 32 can be dissolved and removed.

Then, a step of forming a first electrode layer 35 is performed. This step is a step of mainly forming the first electrode 25 on the cantilever 23.

Figure 6F:
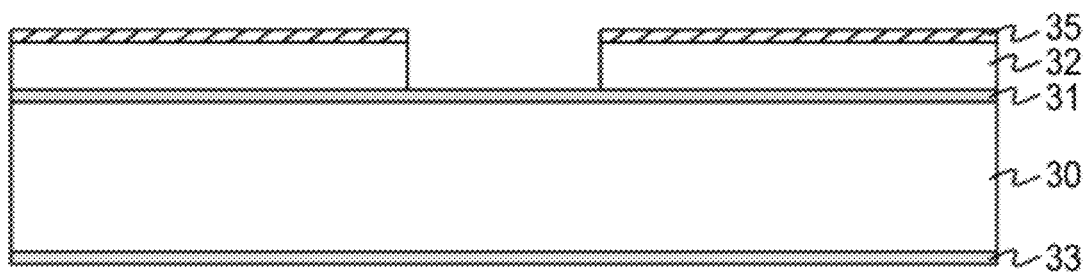
FIG. 6F is a view showing each step of the production method of the electric power device 20 according to this embodiment.

For example, when Ti/Pt is used as a material for the first electrode 25, a film of Ti/Pt is formed on a region (comb portion) at least forming a cantilever on the second semiconductor substrate layer 32 using a sputtering device and a metal mask. FIG. 6F shows a state after the film of Ti/Pt is formed.

Then, a step of forming a piezoelectric element layer 36 is performed. This step is a step of mainly forming the piezoelectric element 24 so as to connect to the cantilever 23.

First, a process of forming a film of PZT to form the piezoelectric element layer 36 is performed. For example, the film can be formed on the first electrode layer 35 and the second oxide film 31 using a sputtering device.

Then, a resist application process and a baking process on the piezoelectric element layer 36 are performed. These processes can be performed with the same devices and under the same conditions as the above-described resist application process and baking process.

Figure 7:
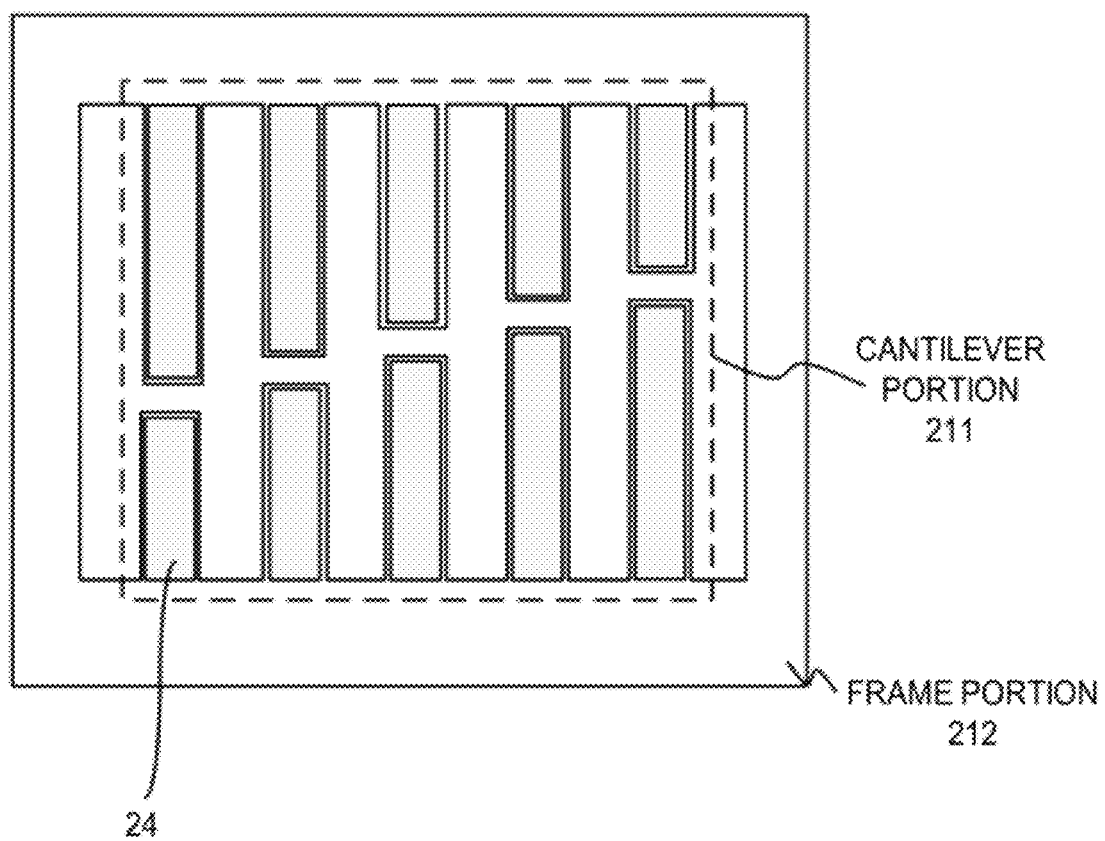
FIG. 7 is a view for illustrating the production method of the electric power device 20 according to this embodiment.

Then, an exposure process and a development process are performed. The exposure process is, for example, a process for exposure through a photo mask patterned to have the shape of the cantilever portion 211, that is, a pattern of the piezoelectric element 24 as illustrated in FIG. 7 using a double-sided exposure device. The development process is a process for removing the resist while leaving a portion that is not exposed by the photo mask.

Next, an etching process of the piezoelectric element layer 36 is performed. This process is a process for dissolving and removing a portion without the resist film on the piezoelectric element layer 36. For example, when wet etching using nitric acid and fluorinated acid is performed on the piezoelectric element layer 36, the portion without the resist film can be dissolved and removed.

Figure 6G:
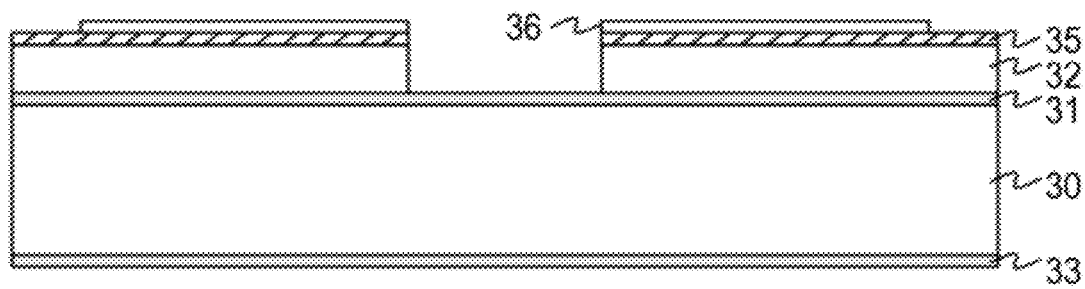
FIG. 6G is a view showing each step of the production method of the electric power device 20 according to this embodiment.

Then, a resist delamination process is performed. Resist delamination can be performed in the same manner as the resist delamination described above. FIG. 6G shows a state after the etching process and the resist delamination process of the piezoelectric element layer 36 are performed.

Then, a step of forming a second electrode layer 37 is performed. This step is a step of mainly forming the second electrode 26 on the cantilever 23.

In this step, a process for forming a film of Cr/Au to form the second electrode layer 37 is first performed. For example, this process can be performed by vacuum deposition, and the film is formed on the piezoelectric element layer 36 and the second semiconductor substrate layer 32.

Then, a resist application process and a baking process on the second semiconductor substrate layer 32 are performed. These processes can be performed with the same devices and under the same conditions as the above-described resist application process and baking process.

Then, an exposure process and a development process are performed. The exposure process is, for example, a process for exposure through a photo mask patterned to have a pattern of the shape of the cantilever portion 211 on the piezoelectric element layer 36 using a double-sided exposure device. This pattern may be substantially the same as the pattern in the exposure of the piezoelectric element layer 36. The development process is a process for removing the resist while leaving a portion that is not exposed by the photo mask.

Further, an etching process of the second electrode layer 37 is performed. This process is a process for dissolving and removing a portion without the resist film on the second electrode layer 37. For example, when wet etching using nitric acid and fluorinated acid (Cr: ceric ammonium nitrate, Au: iodine-potassium iodide) is performed on the piezoelectric element layer 36, the portion without the resist film can be dissolved and removed.

Figure 6H:
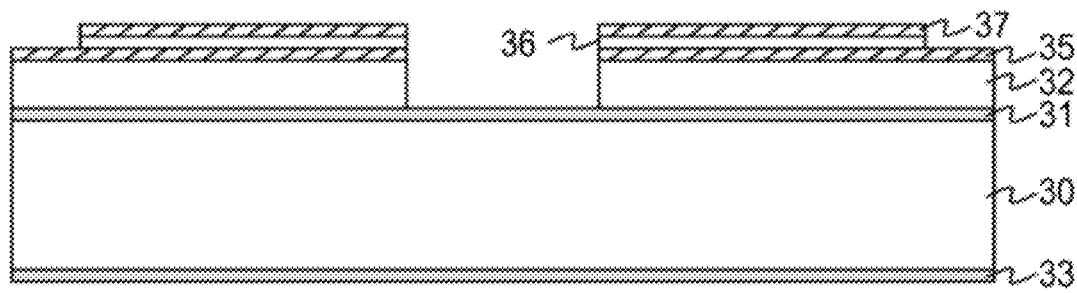
FIG. 6H is a view showing each step of the production method of the electric power device 20 according to this embodiment.

Then, a resist delamination process is performed. Resist delamination can be performed in the same manner as the resist delamination described above. FIG. 6H shows a state after the etching process and the resist delamination process of the second electrode layer 37 are performed.

Then, a step of forming the first semiconductor substrate layer 30 so as to match the shape of the support portion that secures one end of the cantilever is performed.

First, a resist application process and a baking process on a back surface (lower surface) of the first semiconductor substrate layer 30 are performed. These processes can be performed with the same devices and under the same conditions as the above-described resist application process and baking process.

Then, an exposure process and a development process are performed. The exposure process is, for example, a process for exposure through a photo mask patterned to have the shape of the support portion that secures one end of the cantilever, that is, a pattern with opposite ends in an X-axis direction of the support portion 22 remaining as illustrated in FIG. 5C using a double-sided exposure device. The development process is a process for removing the resist while leaving a portion that is not exposed by the photo mask.

Figure 6I:
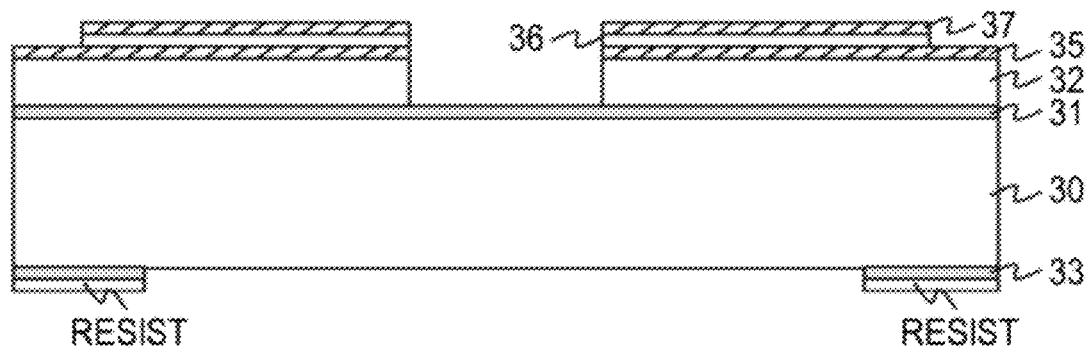
FIG. 6I is a view showing each step of the production method of the electric power device 20 according to this embodiment.

Then, an etching process of the second oxide film 33 is performed. This process is a process for dissolving and removing a portion without the resist film on the second oxide film 33. For example, when reactive ion etching (RIE) is performed using a CHF3 gas on the second oxide film 33, the portion without the resist film can be dissolved and removed. FIG. 6I shows a state after the etching process of the second oxide film 33 is performed.

Then, a resist delamination process is performed. This process is a process for removing the photoresist existing on the remaining first semiconductor substrate layer 30 and cleaning with pure water. The resist delamination process may be performed in the same manner as a known process method, and thus detailed descriptions thereof will be omitted.

Figure 6J:
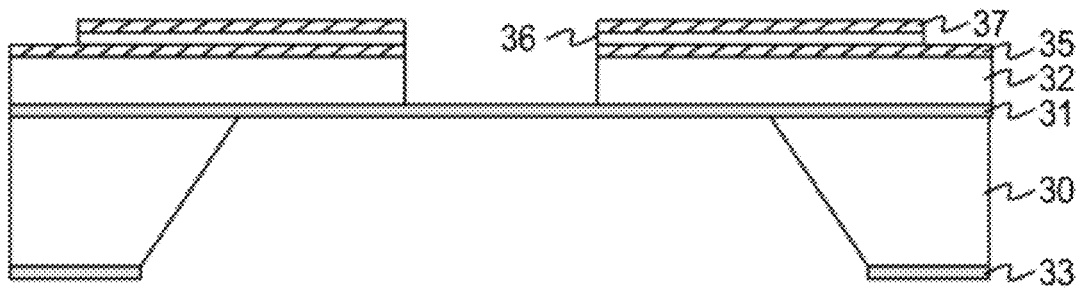
FIG. 6J is a view showing each step of the production method of the electric power device 20 according to this embodiment.

Then, an etching process of the first semiconductor substrate layer 30 is performed. When wet etching is performed for about 180 minutes using, for example, a 30% KOH solution on the first semiconductor substrate layer 30, the portion without the resist film can be dissolved and removed. FIG. 6J shows a state after anisotropic etching of the first semiconductor substrate layer 30 is performed. When the wet etching is performed using the 30% KOH solution, as shown in FIG. 6J, the first semiconductor substrate layer 30 is formed into an etching shape along a (111) crystal face (for example, a shape having a taper of 54.7 degrees).

Figure 6K:
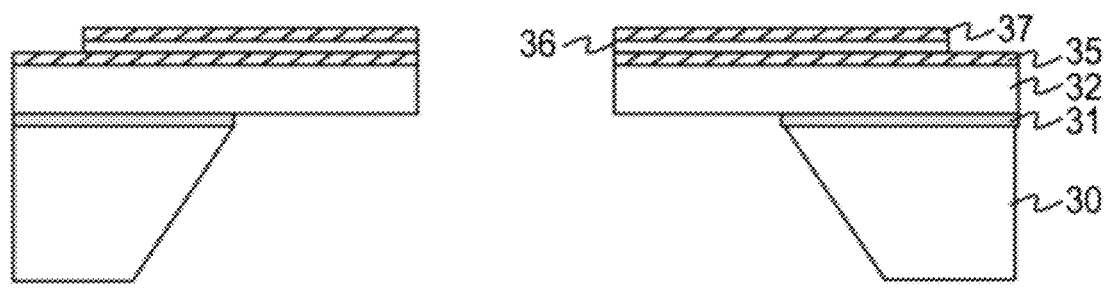
FIG. 6K is a view showing each step of the production method of the electric power device 20 according to this embodiment.

Then, a step of removing (delaminating) the first oxide film 31 is performed. When wet etching is performed using, for example, a 10% HF solution on the first oxide film 31, the first oxide film 31 is delaminated at a portion that is not covered with the first semiconductor substrate layer 30. FIG. 6K shows a state after the first oxide film 31 is delaminated.

As described above, the production method of the electric power device 20 of the present disclosure can be performed. In the production method, steps of pure water cleaning and drying may be introduced into each step as required.

In the production method of the electric power device 20 of the present disclosure, the steps of the production method may be omitted or corrected according to the shape of the electric power device 20, and the order of the steps may be rearranged within the range of consistency. Further, the electric power device 20 produced by the production method is not limited to the shape of the electric power device 20 illustrated in FIG. 5.

The preferred embodiment of the present disclosure has been described above, but the present disclosure should not be limited to the embodiment, and various modification, additions and omissions may be made by those skilled in the art without departing from the idea and the scope described in Claims.

For example, in the above-described embodiment, the insulin infusion device 1 is exemplified for description as the device to which the electric power device 20 is applied, but the present disclosure is not limitedly applied to the insulin infusion device 1, and the electric power device 20 may be used as an electric power source of other implantable medical devices such as a cardiac pacemaker for correcting the arrhythmia or an endoscopic capsule. In this case, the number of electric power units and a resonance frequency of the electric power device 20 can be adjusted according to an operating environment or required electric power of the medical device. Also, the electric power device 20 of the present disclosure is not limitedly applied to the implantable medical device, and may be widely used as a self-generating electric power source that can receive waves propagating through a space or a medium to generate a voltage. Particularly, the electric power device 20 of the present disclosure has a large merit as an electric power source that can perform self generation as a replacement of a solar cell in a place without light irradiation.

Figure 8A:
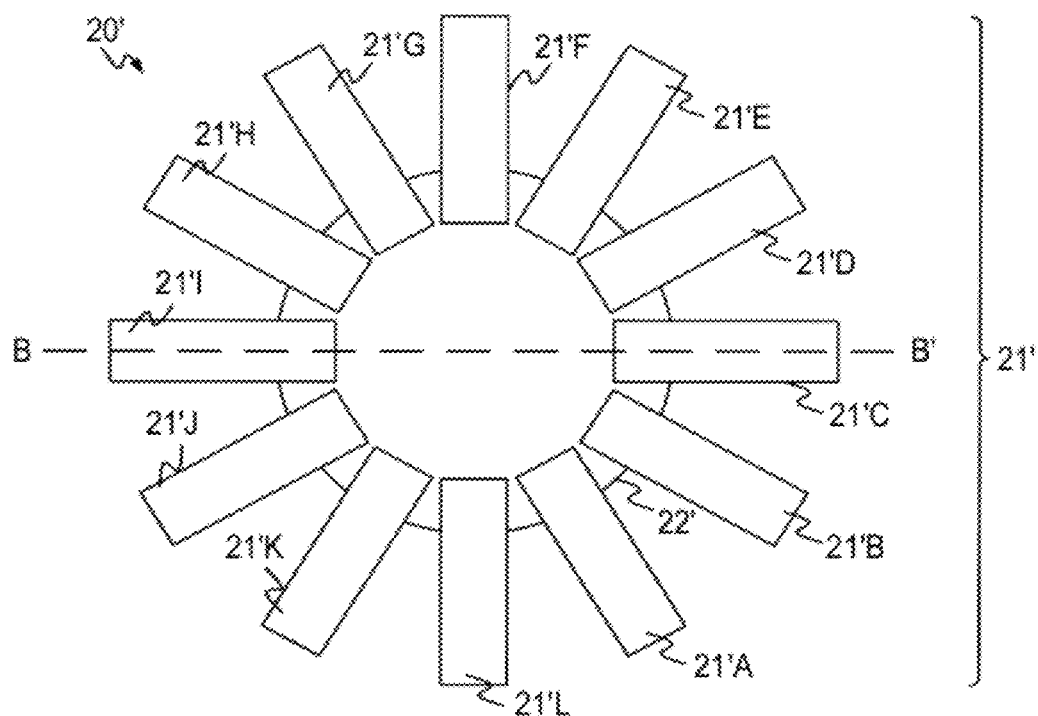
FIG. 8 is a view showing a variant of the electric power device 20 according to this embodiment.
Figure 8B:
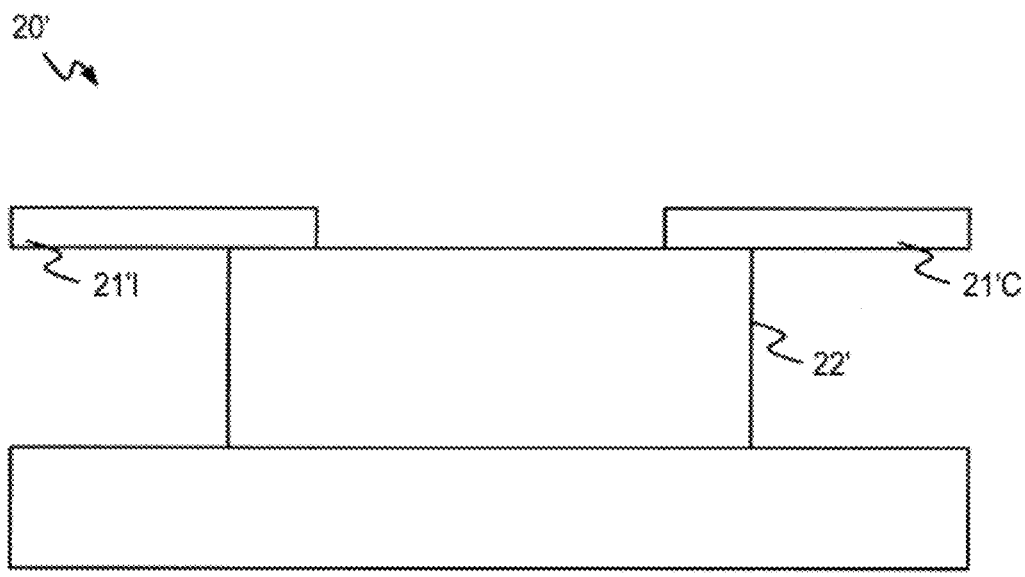

In the above-described embodiment, the case is exemplified where the plurality of electric power units (cantilevers) 21A to 21E are arranged in parallel in the electric power generation portion 21, but the present disclosure is not limited to this. For example, as shown in FIG. 8, in an electric power generation portion 21', a plurality of electric power units (cantilevers) 21'A to 21'L may be concentrically arranged on a support base 22'. FIG. 8A is a top view showing the plurality of electric power units 21'A to 21'L concentrically arranged on the support base 22', and FIG. 8B is a sectional view taken along the dotted line B-B' in FIG. 8A. The plurality of electric power units (cantilevers) 21A to 21'L are concentrically arranged to have a non-directional property, which facilitates receiving waves propagating through a space or a medium from all directions and resonance.

Further, in the embodiment, the cantilever having one end secured and the other end that is the free end is exemplified as the resonant body, but the resonant body may be formed into a shape of a double supported beam secured at opposite ends.

What is claimed is:

1. An electric power device comprising:
   a resonant portion configured to resonate in response to receiving sound waves propagating through a space or a medium, wherein the resonant portion comprises a cantilevered portion having one end secured and one end free and has a predetermined resonance frequency;
   a piezoelectric element connected to said resonant portion, wherein the piezoelectric element is configured to generate a voltage according to a resonance of said resonant portion; and
   a first electrode and a second electrode located on opposite surfaces of said piezoelectric element, wherein the first and second electrodes are configured to supply electric power to an implantable medical device,
   wherein the predetermined resonance frequency of the resonant portion corresponds to an operating environment of the implantable medical device.

2. The electric power device according to claim 1, wherein said resonant portion includes a plurality of resonant bodies.

3. The electric power device according to claim 2, wherein said plurality of resonant bodies include at least two resonant bodies having different predetermined resonance frequencies.

4. The electric power device according to claim 2, wherein said plurality of resonant bodies are arranged in parallel.

5. The electric power device according to claim 2, wherein said plurality of resonant bodies are arranged concentrically.

6. A system comprising:
   an implantable medical device; and
   an electric power device comprising:
   a resonant portion configured to resonate in response to receiving sound waves propagating through a space or a medium, and wherein the resonant portion comprises a cantilevered portion having one end secured and one end free and has a predetermined resonance frequency;
   a piezoelectric element connected to said resonant portion, wherein the piezoelectric element is configured to generate a voltage according to a resonance of said resonant portion; and
   a first electrode and a second electrode located on opposite surfaces of said piezoelectric element, wherein the first and second electrodes are configured to supply electric power to the implantable medical device,
   wherein the predetermined resonance frequency of the resonant portion corresponds to an operating environment of the implantable medical device.

7. A system comprising:
   an electric power device comprising:
   a resonant portion configured to resonate in response to receiving sound waves propagating through a space or a medium, wherein the resonant portion has a predetermined resonance frequency;
   a piezoelectric element connected to said resonant portion, wherein the piezoelectric element is configured to generate a voltage according to a resonance of said resonant portion; and
   a first electrode and a second electrode located on opposite surfaces of said piezoelectric element, wherein the first and second electrodes are configured to supply electric power to an implantable medical device,
   wherein the predetermined resonance frequency of the resonant portion corresponds to an operating environment of the implantable medical device; and
   a frequency generation device configured to generate the sound waves having a frequency component corresponding to the predetermined resonance frequency toward said resonant portion included in said electric power device.

8. An electric power generation method comprising:
   receiving sound waves propagating through a space or a medium at a resonant portion of an electric power device, Wherein said receiving the sound waves causes the resonant portion to resonate, and wherein the resonant portion comprises a cantilevered portion having one end secured and one end free and has a predetermined resonance frequency;
   generating, at a piezoelectric element connected to said resonant portion, a voltage according to a resonance of said resonant portion; and
   supplying electric power to an implantable medical device from a first electrode and a second electrode located on opposite surfaces of said piezoelectric element,
   wherein the predetermined resonance frequency of the resonant portion corresponds to an operating environment of the implantable medical device.

9. The electric power device of claim 1, wherein the implantable medical device is an insulin infusion device.

10. The electric power device of claim 1, wherein the implantable medical device is a cardiac pacemaker.

11. The electric power device of claim 2, wherein the number of the plurality of resonant bodies corresponds to a required electric power of the implantable medical device.

12. The system of claim 6, wherein the implantable medical device is an insulin infusion device.

13. The system of claim 6, wherein the implantable medical device is a cardiac pacemaker.

* * * * *

UNITED STATES PATENT AND TRADEMARK OFFICE
CERTIFICATE OF CORRECTION

PATENT NO.        : 8,736,146 B2
APPLICATION NO.   : 12/641662
DATED             : May 27, 2014
INVENTOR(S)       : Fujii Page 1 of 1

It is certified that error appears in the above-identified patent and that said Letters Patent is hereby corrected as shown below:

In the Specification:

In Column 8, Line 65, delete "second oxide film 31" and insert -- second oxide film 33 --, therefor.

In Column 11, Line 24, delete "21A" and insert -- 21'A --, therefor.

In the Claims:

In Column 12, Line 40, in Claim 8, delete "Wherein" and insert -- wherein --, therefor.

Signed and Sealed this
Ninth Day of September, 2014

Michelle K. Lee
*Deputy Director of the United States Patent and Trademark Office*